(12) United States Patent
Ogden et al.

(10) Patent No.: US 6,295,201 B1
(45) Date of Patent: Sep. 25, 2001

(54) BUS BAR HAVING EMBEDDED SWITCHING DEVICE

(75) Inventors: Christopher Ogden, Cary; Denis M. Lindsey, Carpentersville; Michael Stibgen, Woodstock, all of IL (US)

(73) Assignee: Stratos Lightwave, Inc., Chicago, IL (US)

(*) Notice: Subject to any disclaimer, the term of this patent is extended or adjusted under 35 U.S.C. 154(b) by 0 days.

(21) Appl. No.: 09/587,751

(22) Filed: Jun. 5, 2000

Related U.S. Application Data

(63) Continuation-in-part of application No. 09/128,562, filed on Aug. 4, 1998, now abandoned.

(51) Int. Cl.[7] ................................................. H05K 7/20
(52) U.S. Cl. .......................... 361/704; 361/707; 361/710; 257/706; 257/709; 165/80.3; 174/16.3
(58) Field of Search ................................. 361/700–710, 361/717–723, 736, 752, 774; 174/16.2, 16.3, 252, 256; 165/80.2, 80.3, 80.4, 185, 165; 29/854; 257/706–727

(56) References Cited

U.S. PATENT DOCUMENTS

| | | | |
|---|---|---|---|
| 4,589,057 | 5/1986 | Short | 361/386 |
| 4,966,563 | 10/1990 | Pierce et al. | 439/729 |
| 5,153,449 | * 10/1992 | Crook et al. | 307/66 |
| 5,313,097 | * 5/1994 | Haj-Ali Ahmadi et al. | 257/706 |

\* cited by examiner

Primary Examiner—Leo P. Picard
Assistant Examiner—Michael Datskovsky
(74) Attorney, Agent, or Firm—Steven M. Evans

(57) ABSTRACT

A bus bar assembly having a high-speed switching device, a bus bar, and a heat sink. The switching device is integrated into a cavity on the top surface of the bus bar, and the heat sink is mechanically coupled to the bottom surface of the bus bar. The bus bar may include capacitors that are positioned upside down on the top surface of the bus bar to more effectively communicate heat from the capacitor to the bus bar and then the heat sink. The heat sink may be formed from a pair of parallel plates that oppose each another to form a cooling channel, wherein a coolant, such as gas or water, may be passed through. An interior surface of one of the plates may incorporate a cooling structure such as grooves or fins.

20 Claims, 4 Drawing Sheets

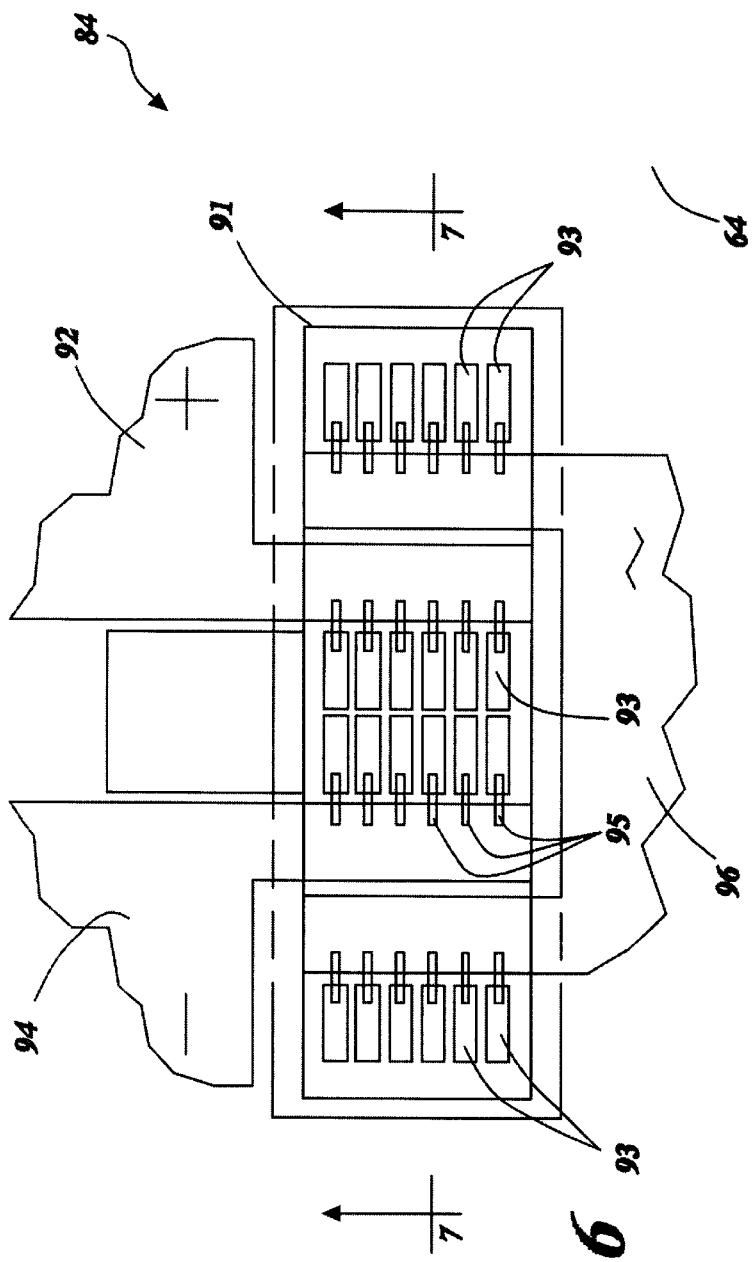
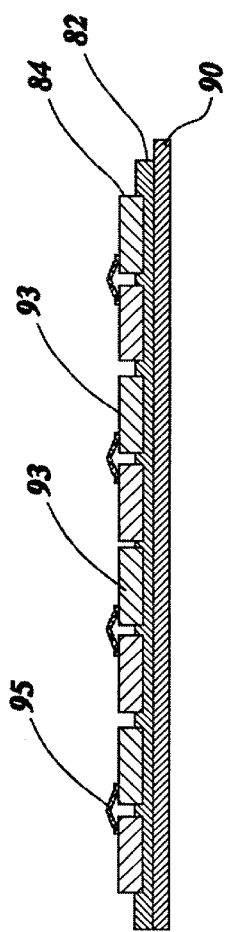
Fig. 6
Fig. 7

BUS BAR HAVING EMBEDDED SWITCHING DEVICE

CONTINUATION-IN-PART

This application is a continuation-in-part of U.S. patent application filed Aug. 4, 1998, having Ser. No. 09/128,562, now abandoned.

FIELD OF THE INVENTION

The invention relates generally to semiconductor assemblies having a power distribution plate and a heat sink. More particularly, the present invention relates to a bus bar assembly including a high current switching device powered by and embedded into a bus bar, wherein a heat sink is attached directly to the same bus bar.

BACKGROUND OF THE INVENTION

Switching assemblies having a switching device associated with a power distribution plate and a heat sink are known in the art. Generally, these switching devices are semiconductors that utilize high current transistors. Operation of a high current switching device produces a large amount of heat proportional to the respective size of the device. Furthermore, the power distribution plate or bus bar used with the high current device also carries a relatively high level of current that generates even more heat. The combined heat generated by the bus bar and switching device is sufficient to damage electrical components within the switching device. Therefore, the heat generated within the switching device and the bus bar must be drawn away by a heat sink to prevent damage to the electrical components.

High current switching devices are used in combination with high performance motors and generators, as found in automobiles and other motorized vehicles. Advancement in motor and generator technology, and more specifically the inclusion of electrical controls and computers with such devices, has compounded the need for better performing switching devices. More specifically, technological advancements now require switching assemblies to incorporate (1) a compact package, (2) a low resistance power distribution plate or bus bar, (3) low inductance of the overall switching assembly, and (4) superior heat dissipation.

One example of an advancement in generator and motor technology that requires improved switching assemblies is the Integrated Starter Alternator Damper (ISAD) device. The ISAD is a sophisticated system that replaces starters, flywheels, generators, and dampers in vehicles. The ISAD requires sophisticated switching assemblies having superior functional characteristics to provide high current and voltage for their various electromechanical components, which include electronic controls and sensors.

With these considerations in mind, the known art provides bus bars that are mechanically attached to the top of switching devices. These bus bars are usually heavy, solid metal structures that carry considerable current and generate substantial heat. The switching devices typically use high current transistors, such as Integrated Gate-type Bipolar Transistors (IGBT) or Field-effect Transistors (FET). A heat sink is attached to the switching device in order to dissipate heat produced by the bus bar and the switching device. As known in the art, heat sinks may comprise parallel copper or aluminum plates carrying a coolant gas or liquid therebetween.

Considering the power and current demands of modern applications, the known art separates the bus bar and heat sink in a manner that is either unworkable or damaging to the switching device. Thus, there is a need for a switching or bus bar assembly having a switching device, bus bar, and heat sink, wherein the bus bar and heat sink are adjacent to one another and more compact is size.

SUMMARY OF THE INVENTION

This present invention provides a bus bar assembly having a high-speed switching device, a bus bar, and a heat sink. The switching device is integrated into a cavity on the top surface of the bus bar, and the heat sink is mechanically coupled to the bottom surface of the bus bar. The bus bar may include capacitors that are positioned upside down on the top surface of the bus bar to more effectively communicate heat from the capacitor to the bus bar and then the heat sink. The heat sink may be formed from a pair of parallel plates that oppose each another to form a cooling channel, wherein a coolant, such as gas or water, may be passed through. An interior surface of one of the plates may incorporate a cooling structure such as grooves or fins.

BRIEF DESCRIPTION OF THE DRAWINGS

FIG. 6 is an enlarged view of a transistor array shown in FIG. 5; and

FIG. 7 is a cross-sectional view of the bus bar assembly shown in and taken along line 7—7 of FIG. 6.

DETAILED DESCRIPTION OF THE PREFERRED EMBODIMENTS

Figure 1:
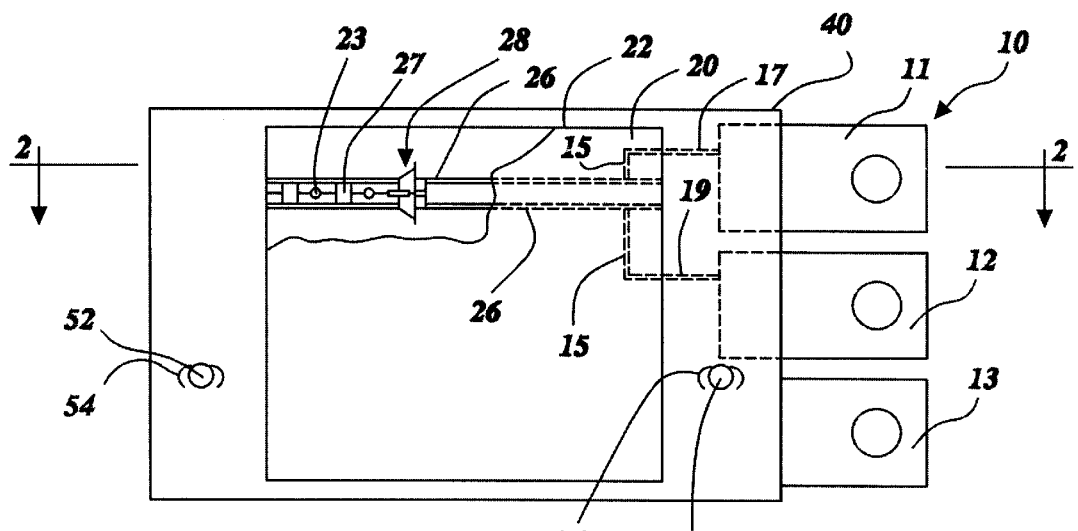
FIG. 1 is a top, cut-away view of a bus bar assembly configured in accordance with a first embodiment of the present invention.
Figure 2:
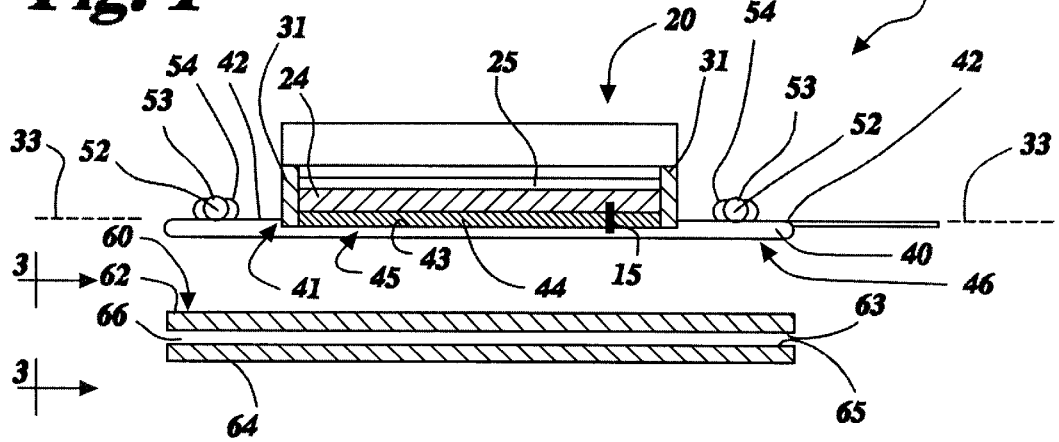
FIG. 2 is a cross-sectional view of the bus bar assembly shown in and taken along line 2—2 of FIG. 1.

Turning now to the drawings, FIGS. 1 and 2 show a bus bar assembly 10 configured in accordance with a first embodiment of the present invention. The bus bar assembly 10 includes a high speed switching device 20 that can be used for controlling motors and alternators. The bus bar assembly 10 also includes a bus bar 40 and a heat sink 60. The bus bar assembly 10 enables the switching device 20 to access a high current with a low resistance from the bus bar 40 while maintaining low inductance.

In accordance with the present invention, the switching device 20 is mounted within a cavity 41 on the top surface 42 of the bus bar 40. The heat sink 60 is mounted to a bottom surface 46 of the bus bar 40. The high speed switching device 20 is embedded directly into the bus bar 40 and located within the cavity 41. The bottom surface 45 of the switching device 20 is located immediately adjacent to the top surface 43 of the cavity 41. Accordingly, the bottom surface 45 of the switching device 20 falls below a geometric plane 33 defined by the top surface 42 of the bus bar 40.

The switching device 20 can be formed into the bus bar 40 during production of the bus bar 40. In other methods of production, the cavity 41 can be formed into the bus bar 40 first, and the switching device 20 secured within the bus bar 40 second after the formation of the cavity 41. If it is desired to place the switching device into the cavity 41 after cavity has been formed, and not simultaneously, numerous techniques known in the art may be used to use to secure the switching device 20 within the bus bar 40.

The switching device 20 is a semiconductor device incorporating high current transistors 28. High performance engines and alternators, as found in automobiles, or preferably ISAD style generators, require substantial current switching. The switching device 20 includes one or more power bridges 26. The bus bar 40 includes input lead 11, output lead 12, and ground lead 13. Each power bridge 26 preferably includes an array of Insulated Gate-type Bipolar Transistors (IGBT) 28 which combine to provide currents to the windings of a motor or a generator. Other high current components may be contained within substrates 24, 25 of the switching device 20. Typically, a collector plate 27 internal to the switching device 20 provides current to the transistors 28 and electrical components 23 contained within the switching device 20. In the preferred embodiment of this invention, an IGBT switching device is employed.

The switching device 20 is directly powered via the bus bar 40. The bus bar 40 of the present invention functions as a current plate, voltage source, and ground source for the collector plate 27, individual transistors 28, and other electrical components 23 of the switching device 20. By mounting the switching device 20 directly on top of the bus bar 40, or integrally into the bus bar 40, electrical power lead wires to the switching device 20 are eliminated.

Contacts 15 extend downward from the switching device 20 to merge with the bus bar 40, and electrically connect to input trace 17 and output trace 19 within the bus bar 40. In this manner, the housing 22 shields the contents of the switching device 20 and portions of the bus bar 40 contained therein. One or more conductive components of the switching device 20 are embedded into the bus bar 40. Components within the switching device 20 that may be embedded into the bus bar 40 include the contacts 15, collector plate 27, or other electrical components. Sonic welding made be used to secure one or more contacts 15 of the switching device, which are interconnected to a portion of the collector plate 27, to the bus bar 40. The contacts 15 provide an electrical connection between the bridge 26 in the switching device 20 and the input and output traces 17,19 within the bus bar 40. Other suitable attachment processes include spot welding or gluing non-conductive portions of the substrates within the switching device to a laminated portion (not shown) of the bus bar 40. Portions of the substrates within the switching device 20 that must be insulated from the bus bar 40 may be laminated or otherwise provided an insulated layer 44.

Preferably, the switching device substrates 24, 25, and more specifically, the collector plate 27 therein, are aligned horizontally over the bus bar 40. Alternatively, the bus bar 40 may include electrically conductive elastomeric material located in electrically conductive compression points, as disclosed in U.S. Pat. No. 4,589,057 to Short, and incorporated by reference herein. Portions of the bus bar 40 may be laminated or sheathed to insulate nonconductive or sensitive electrical components from the current of the bus bar 40. Internal support structures 31 support substrates 24,25 within the switching device 20. The internal support structures 31 align vertically to the bus bar 40 and allow vertical placement of additional electrical components and substrates over the bus bar 40.

The bus bar 40 is preferably made from highly conductive material such as copper or aluminum. The high current conducted by the bus bar 40 carries sufficient heat to potentially damage surrounding electrical components. The bus bar 40 is located directly adjacent to the heat sink 60, thereby providing an improved thermal solution to the switching assembly 10 as a whole. With the switching device embedded into with the top surface 42 of the bus bar 40, the heat sink 60 can be mechanically coupled to a bottom surface 46 of the bus bar 40.

Large capacitors 52 are typically incorporated into the bus bars 40. The large capacitors 52 store considerable charge, and as such generate considerable heat off the bus bar 40. In this embodiment, the capacitors 52 are "reversed" or positioned upside down so that the top of each capacitor is in direct contact with the bus bar 40. One or more leads 54 extend from the bus bar 40 to the bottom 53 of the capacitors 52. The capacitors may be internally designed to locate the most thermally conductive substrate or component at its bottom, adjacent to the top surface 42 of the bus bar 40. Reversing the capacitor 52 on the bus bar 40 enables heat generated by the capacitor 52 to communicated directly to the heat sink 60.

The heat sink 60 may be mechanically coupled to the integrated bus bar 40 and switching device 20 through mechanical attachments and couplers, such as threaded nuts and/or screws (not shown). Preferably, the heat sink 60 includes a top and bottom thermally conductive plate 62 and 64 such as copper or aluminum. The top and bottom plates 62 and 64 are preferably made from the same material, or materials, having close thermal expansion coefficients. The two plates are separated by a fluid channel 66, which conducts either liquid or gaseous coolants such as water or air. In an alternative embodiment wherein air is used as the coolant, the heat sink 60 includes only a top plate 62, with the air passing underneath it. The cooling channel 66 is defined by a top and bottom interior surface 63 and 65 of the respective top and bottom plate 62 and 64. In operation, the top and bottom plates 62 and 64 become warm from the bus bar 40, and the coolant flows in a manner that dissipates heat. As the top plate may be warmer than the bottom plate due to its proximity to the bus bar 40, it is possible to create convection currents that assist heat dissipation.

Figure 3:
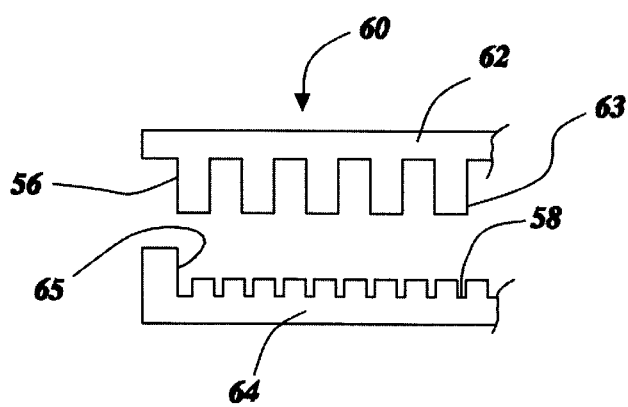
FIG. 3 is a cross-sectional view of the bus bar assembly shown in and taken along line 3—3 of FIG. 2.

FIG. 3 is a cross-sectional view of the heat sink 60 shown FIG. 2. FIG. 3 illustrates one arrangement and design of fins 56, grooves 58, or other cooling structure incorporated into the surfaces of the plate 62, 64 to enhance the cooling effect within the cooling channel 66. FIG. 3 shows that the top interior surface 63 includes fins, and the bottom interior surface 65 incorporates grooves. This invention is intended to encompass various heat sinks used in this arrangement which incorporate fins and grooves on either top surface 63 or bottom surface 65. With respect to embodiments using air as a coolant, another embodiment of the invention may provide for the heat sink 60 to comprise only for the top plate 62 and fins 56.

The bus bar assembly 10 maintains a compact package that is necessary for its employment with modernized motors and generators. The proximity of the bus bar 40, with the heat sink 60 and switching device 20, minimizes the inductance of the system. Furthermore, the bus bar 40 is in direct thermoconductive association with the heat sink 60. Thus, the bus bar assembly 10 of the present invention may provide higher current and voltage to the system while maintaining temperatures sufficiently cool for sustained operation of the switching device 20.

Figure 4:
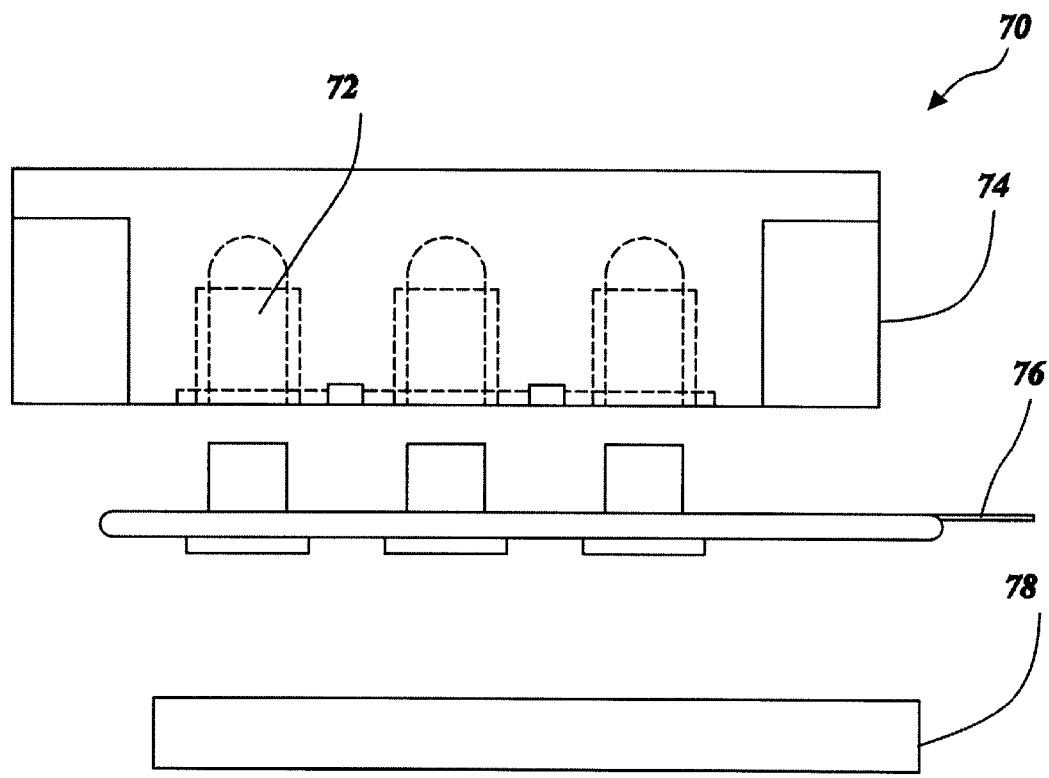
FIG. 4 is an exploded side view of a bus bar assembly configured in accordance with a second embodiment of the present invention, wherein mounting holes are shown in shadow.

FIG. 4 shows another bus bar assembly 70 configured in accordance with a second embodiment of the present invention. In this embodiment the bus bar 76 is mechanically attached to the switching device 74. The switching device 74 incorporates a plurality of contact holes 72 that align with corresponding holes (not shown) of the bus bar 76 to receive mechanical fasteners therein. Examples of mechanical fasteners include screws and/or bolts engaged with threaded apertures. Alternatively, adhesives may also serve to retain insulative portions of the switching device 74 and bus bar 76. The heat sink 78 is attached through mechanical attachment means to the bottom surface of the bus bar 76. All other elements and features of this embodiment are encompassed in the description accompanying FIGS. 1 through 3.

The bus bar assembly 70 has the added advantage of providing for easy removal and insertion of the switching device 74. In general, switching devices have a shorter life span than associated components of the system they operate. Thus, an IGBT switch will fail before an ISAD device. In the arrangement shown by the bus bar assembly 70, the switching device 74 may easily be disassembled from the bus bar 76. In addition, locating the bus bar 76 below the switching device 74 avoids the additional step of initially removing a bus bar 76 to access the switching device 74.

Figure 5:
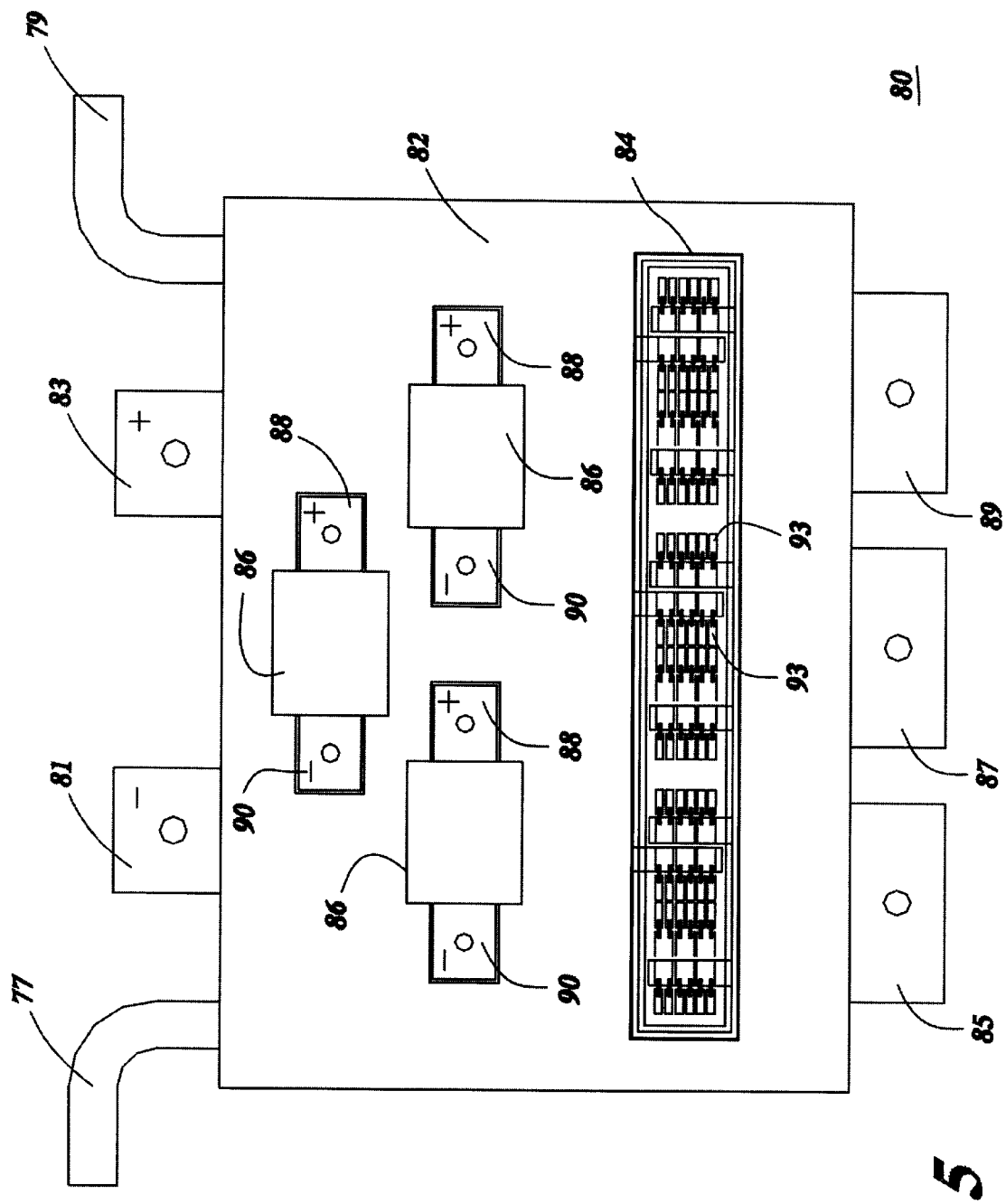
FIG. 5 is a plan view of a bus bar assembly configured in accordance with a third embodiment of the present invention.

FIGS. 5–7 show a third embodiment of the present invention. FIG. 5 shows a bus bar assembly 80 having a bus bar 82, a switching array 84, and capacitors 86. The capacitors 86 are constructed of flat substrate material that may be laser or mechanically etched to obtain a desired capacitance. The relatively flat capacitors 86 and contacts 88, 90 enable the height of the bus bar assembly 80 to be minimized. The housing of the bus bar 82 is preferably made of a ceramic material.

Electrical tabs 81, 83, 85, 87 and 89 provide electrical power connections to and from the bus bar assembly 80. In the preferred embodiment, tab 81 corresponds to the negative (−) node, tab 83 corresponds to the positive node, and tabs 85, 87, 89 correspond to the phase output (3×). Input tube 77 and output tube 79 provide a flow path for a liquid cooling system for the bus bar assembly 80. Transistors 93 of the switching array 84 function as a switching device.

FIG. 6 illustrates an enlarged viewed of the switching array 84. The switching array 84 is embedded into the bus bar 82 and includes a plurality of individual transistors 93. The transistors 93 are connected to negative (−) conductor plate 94, conductor plate (+) 92, and alternating current conductor plate 96 (~) by wire bonds 95. Conductor plates 92, 94, 96 are manufactured by punching the required shape from a sheet of conductive material. The conductor plates 92, 94, 96 are then formed, if necessary, to the desired shape, then plated with a conductive material. The switching array 84 and the bar assembly 80 are preferably sealed in an encapsulant material at or near the final stages of production.

FIG. 7 is a cross-sectional view of the switching array 84 shown in FIG. 6. FIG. 7 also shows the bus bar 82 and the metal heat sink 90. The wire bonds 95 are shown and the transistors 93 and the conductor plates 92, 94, 96. As illustrated, the transistors 93 of the switching array 84 are embedded into the bus bar 82. A silicon potting 97 covers the bus bar 82 and the switching array 84.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim as our invention:

1. A bus bar assembly, comprising:
   a bus bar having a top surface and a bottom surface, the top surface including a cavity for receiving a bottom surface of a switching device;
   electrical input and output contacts located on the top surface of the cavity for powering a switching device; and
   a switching device having a top surface and a bottom surface, the bottom surface of the switching device being located within the cavity of the bus bar, and the switching device is powered by the input and output contacts on the top surface of the cavity.

2. The bus bar assembly of claim 1, further comprising:
   a heat sink attached to the bottom surface of the bus bar.

3. The bus bar assembly of claim 1, further comprising:
   an external input lead and an external output lead on the bus bar for providing power to the bus bar and the switching device within the cavity of the bus bar.

4. The bus bar assembly of claim 1, wherein the switching device is high speed.

5. The bus bar assembly of claim 1, wherein the switching device is a high current device.

6. The bus bar assembly of claim 1, wherein the bottom surface of the switching device, located within the cavity of the bus bar, falls below a geometric plane formed by the top surface of the bus bar.

7. The bus bar assembly of claim 1, further comprising:
   electrical connections between the switching device and the external input lead and the external output lead of the bus bar so as to enable the switching device to be powered via the bus bar.

8. The bus bar assembly of claim 1, further comprising:
   a capacitor having a top and a bottom, and electrical leads located on the bottom of the capacitor;
   said leads of the capacitor being connected to the bus bar; and
   said capacitor being mounted on the bus bar upside down so that the top of the capacitor is in direct contact with the bus bar.

9. The bus bar assembly of claim 1, further comprising:
   an electrical insulating layer between the bottom of the electrical device and the cavity of the bus bar.

10. A bus bar assembly, comprising:
    a bus bar having a top surface and a bottom surface, the top surface including a cavity for receiving a bottom surface of an electrical device;
    electrical input and output contacts located on the top surface of the cavity for powering an electrical device; and
    a switching device having a top surface and a bottom surface, the bottom surface being located within the cavity of the bus bar, and the bottom surface of the switching device falls below a geometric plane formed by the top surface of the bus bar, and the switching device is powered by the input and output contacts on the top surface of the cavity.

11. The bus bar assembly of claim 10, further comprising:
    a heat sink coupled to the bottom surface of the bus bar.

12. The bus bar assembly of claim 11, wherein the heat sink includes a cooling channel.

13. The bus bar assembly of claim 12, further comprising:
    an input tube attached to the heat sink for inputting a cooling medium into the cooling channel; and an output tube attached to the heat sink for outputting cooling medium from the coiling channel.

14. The bus bar assembly of claim 10, further comprising:

an external input lead and an external output lead on the bus bar for powering the switching device via the bus bar.

15. The bus bar assembly of claim 11, wherein the switching device includes an array of transistors.

16. The bus bar assembly of claim 14, further comprising:

conductive traces electrically connecting the external input and output leads with the switching device.

17. The bus bar assembly of claim 14, further comprising:

phase leads on the bus bar electrically connected to the switching device.

18. The bus bar assembly of claim 10, further comprising:

an encapsulant enclosing the bus bar and the switching device.

19. A bus bar assembly, comprising:

a bus bar having a top surface and a bottom surface, the top surface including a cavity;

an array of transistors located within the cavity, wherein a portion of the array of transistors falls below a geometric plane created by the top surface of the bus bar;

electrical contacts on the top surface of the cavity for providing power to the array of transistors;

external electrical leads on the bus bar for providing power to the array of transistors via the bus bar; and said array of transistors being electrically connected to the bus bar, thereby enabling the array of transistors to be powered via the bus bar.

20. The bus bar assembly of claim 19, wherein the array of transistors include a top and a bottom surface, and the array of transistors are powered via input and output contacts of the bottom surface of the array of transistors which are in electrical contact with the electrical contacts on the top surface of the cavity.

* * * * *